March 14, 1967 D. C. DICKSON, JR 3,309,241

P-N JUNCTION HAVING BULK BREAKDOWN ONLY
AND METHOD OF PRODUCING SAME

Filed March 21, 1961

*INVENTOR.*
DONALD C. DICKSON, JR.

*BY* John J. McLaughlin

ATTORNEY 3,309,241

P-N JUNCTION HAVING BULK BREAKDOWN ONLY AND METHOD OF PRODUCING SAME

Donald C. Dickson, Jr., 4932 E. Calle del Norte, Phoenix, Ariz. 85018

Filed Mar. 21, 1961, Ser. No. 97,299
1 Claim. (Cl. 148—33.5)

My invention relates in general to improved semi-conductor elements, and more in particular to semi-conductor devices such as zener diodes, with P-N junctions having bulk breakdown only. The invention is also concerned with methods for producing such semi-conductor elements and devices.

In the production and use of semi-conductor devices having P-N junctions, of which zener type diodes are illustrative, it is frequently very important to control accurately the reverse current characteristics, and particularly the voltage at which breakdown at the junction occurs. This is frequently a relatively rigid specification requirement, whether the breakdown is technically due to the so-called zener effect or is of the so-called avalanche type. Since breakdown characteristics have been contingent to a considerable extent on characteristics at the exposed junction edge, and since moreover the characteristics at the junction edge are difficult to control with extreme accuracy, it has been necessary in the past to select semi-conductor devices carefully to meet required breakdown characteristics, and even then the results in use have not been fully satisfactory.

A study of semi-conductor physics indicates that the so-called bulk electrical characteristics, that is the volt-ampere characteristics of the central part of the junction far removed from the exposed junction edge, can be quite accurately controlled. It is obvious therefore that by producing a P-N junction in which the bulk electrical characteristics only will control reverse voltage breakdown, greatly improved semi-conductor devices may be readily produced with greater uniformity and with improved reliability.

The principal object of the present invention is the provision of an improved semi-conductor device with a P-N junction having bulk breakdown characteristics only.

Another object is the provision of an improved method of producing a P-N junction with bulk breakdown only.

The features of the invention will be made clear from the following detailed description, taken with the accompanying drawings, wherein.

Figure 4:
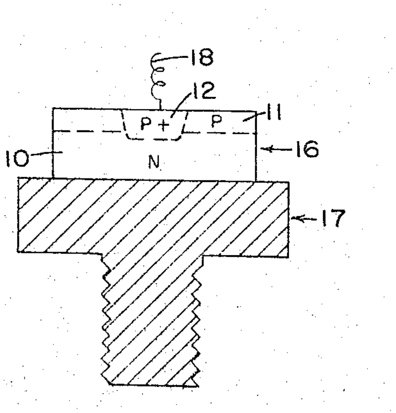
Figure 5:
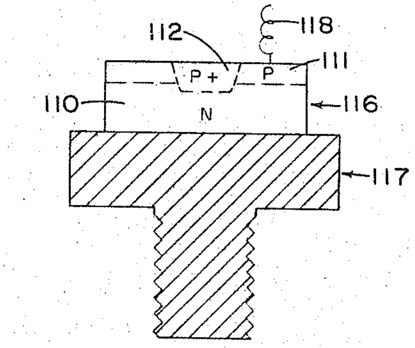
Figure 6:
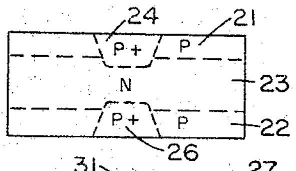
Figure 7:
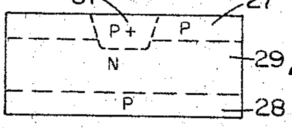

FIGS. 4 and 5 are enlarged sectional views (slightly reduced as contrasted with the other figures) showing completed diodes schematically and without the usual seal for protecting the exposed junction edge, and FIGS. 6 and 7 are enlarged sectional views, partly schematic, showing semi-conductor elements produced in accordance with the present invention and adapted for production of improved transistors.

In accordance with the general features of my invention, I first produce a diffused junction type of semi-conductor element by conventional methods, and thereafter alloy through the diffused layer a doping material having the same general valence electron structure as the previously diffused doping material. Illustratively, if the diffused layer has been formed using an acceptor type material to produce a P layer, then the alloying material will also be an acceptor type material and will produce a P+ regrowth layer of limited area. Preferably the acceptor material in this case is alloyed only near the center portion of the diffused layer, and it should be present in such an amount and so treated that the alloy portion will extend entirely through the diffused layer to form the P+ regrowth region, but never to the exposed edge of the diffused junction. Preferably also the breakdown voltage between the P+ region and the N layer should be substantially lower than the breakdown voltage between the original N material and the diffused P layer. In the resulting semi-conductor element, the controlling breakdown voltage is that between the P+ regrowth region and the N layer and the breakdown voltage at the exposed junction edge between the N layer and the diffused P layer is sufficiently above the controlling breakdown voltage as to be of negligible significance. Further explanation of the manner in which the method is carried out and the product produced may be had from consideration of the following detailed description of a preferred embodiment of the invention.

Figure 1:
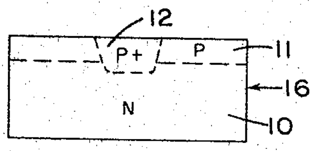
FIG. 1 is an enlarged sectional view, partly schematic, showing one embodiment of the semi-conductor element of a diode produced in accordance with the present invention.

Referring now first to FIG. 1, the semi-conductor element produced in accordance with the present invention has an N layer 10, a diffused P layer 11, and a P+ regrowth region 12 which is confined to the center portion of the semi-conductor wafer or disc and which projects entirely through the diffused P layer so as to be placed directly in communication with the N layer forming a P-N junction.

Figure 2:
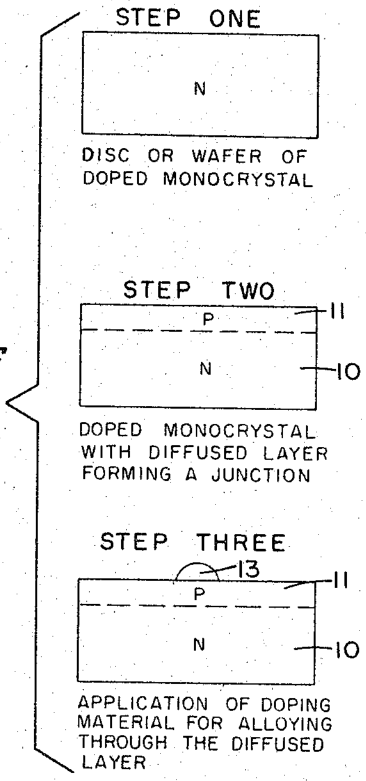
FIG. 2 is a composite view illustrating the several steps which may be employed for producing the diode of FIG. 1.

In fabricating the element shown in FIG. 1, a monocrystal of semi-conductor material such as silicon, germanium or the like is first produced in accordance with conventional practice and the resulting crystal cut up into small discs or wafers of desired geometric configuration as shown at the top of FIG. 2. In accordance with the specific embodiment of the invention shown, this monocrystal is doped during growth with a suitable proportion of a donor material, and a wafer cut therefrom will be comprised entirely of an N type semi-conductor material corresponding physically to the layer 10 in FIG. 1. A suitable acceptor type material is then diffused into one flat surface of this disc in accordance with standard practice to produce the diffused P layer 11 as indicated in the second step showing of FIG. 2. A small proportion of suitable acceptor material 13 is then placed at the center of the diffused P layer in the manner shown in the third step showing of FIG. 2, and heat applied to cause the acceptor material 13 to alloy with the material of the disc in accordance with conventional practices to produce the P+ regrowth region 12. Contrary to conventional practices, however, the acceptor material is alloyed with and through a previously diffused P layer and, as already noted, extends entirely through the diffused P layer. The acceptor material 13 may comprise the same material previously diffused to form the P layer, or suitably it may be a different acceptor material producing modified bulk electrical characteristics at the resulting alloy junction. The bulk breakdown between the P+ regrowth region and the original N type material should, of course, be lower than between the diffused P layer and the original N type material. The typically more abrupt transition between P and N regions of a junction formed by alloying is usually adequate assurance that the breakdown voltage at the center of such a structure will be substantially lower than that of the very much less abrupt P-N junction elsewhere in the structure. Many expedients may be resorted to, however, to be certain that such relationship is maintained.

Whatever the type of junction produced in accordance with the present invention, it is not necessary that the wafer or disc of proper size be first produced and the center portion then alloyed to produce a separate regrowth portion as described hereinabove. In actual commercial practice, a relatively large diffused P-N junction is first produced, the alloying material then applied to the surface at a plurality of separated points, the entire junction then heated to produce a plurality of regrowth portions, and the large wafer then cut up to produce a plurality of semi-conductor elements, each containing a regrowth portion spaced from the exposed edge of the diffused junction portion.

Figure 3:
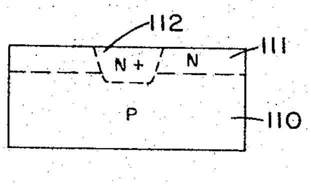
FIG. 3 is a view similar to FIG. 1 but showing one manner in which the invention may be practiced to produce a junction of reversed polarity as contrasted with FIG. 1.

The particular semi-conductor material employed, the doping materials used, and the relationship of the P and N layers may all be modified in accordance with conventional practices without departing from the scope of the present invention. Illustratively, as in FIG. 3, a P type semiconductor material may have donor material diffused into one of its faces to produce a P-N junction of opposite polarity from FIG. 1 and a donor impurity alloyed at or near the center of the N layer 111 to form an N+ regrowth region 112. In other words, the polarity of FIG. 3 is reversed as contrasted with FIG. 1, a procedure common enough in this art, but in all other respects FIGS. 1 and 3 may be identical.

By way of explaining the details of the invention further, I wish to point out that if an N type silicon having a resistivity of approximately 0.029 ohm-centimeter is alloyed with aluminum, a P-N junction may be formed which has a breakdown voltage of approximately 7 volts. Such a semi-conductor element would be similar to that shown in FIG. 1, except that there would be no diffused P layer 11 and the area 12 would represent the alloyed portion of the element. It will be noted that in such case there will be an exposed junction edge on the top face between the P+ regrowth region and the original N type material. On the other hand, if boron were diffused into the surface of a similar N type silicon material having a resistivity of 0.029 ohm-centimeter, a P-N junction could be formed having a breakdown voltage of approximately 20 volts. Such a semi-conductor element would be like the diffused junction shown in the middle figure of FIG. 2. Both of these suggested junction elements would have the same disadvantage in that the breakdown voltage would not be controlled or determined entirely by the bulk electrical characteristics, but rather by the conditions at the exposed junction between the P and N portions. My present invention may, therefore, be considered as a combination of the two postulated elements with better characteristics than either, and having the new function that the breakdown voltage is a function of the bulk electrical characteristics only and remains substantially unaffected, during all normal conditions of use, by the characteristics of the exposed junction edge between the diffused P layer and the original N type material. If, for example, in a semi-conductor element such as postulated, the breakdown voltage between the diffused layer and the original semi-conductor material would be reduced from approximately 20 volts to approximately 15 volts because of an unfavorable environment, the 7 volt breakdown voltage between the regrowth region and the original material would still be controlling and essentially unaffected.

According to another specific example of the manner of practicing the invention, an arsenic-doped silicon semi-conductor material in the form of a wafer was first produced from a monocrystal having a resistivity of approximately 0.017 ohm-centimeter. This wafer was produced in accordance with conventional practices. Boron as $B_2O_3$ suspended in an organic solvent was then applied to one flat surface of the wafer and the so treated wafer then heated at 1300° C. for five hours to diffuse the boron into the arsenic-doped silicon crystal to produce the diffused P layer 11. It was then determined that small discs cut from this diffused wafer had breakdown voltages of approximately 15 volts. Pure aluminum was then applied to the center portion of the P layer and alloyed through the P layer by heating the entire body in an inert atmosphere at a temperature of 850° C. for fifteen minutes to produce the final semiconductor element containing the P+ regrowth region 12.

The resulting semi-conductor element combining an alloyed P-N junction and a diffused P-N junction in parallel had a breakdown voltage of 5.9 volts at a reverse current of one milliampere; and the small signal zener impedance at one milliampere was approximately 15 ohms. The temperature coefficient of breakdown voltage was +2.0 millivolts per degree centigrade. The 15 ohm value of zener impedance at one milliampere indicates a substantially sharper breakdown characteristic than realized in 5.9 volt alloy junction zener diodes not protected by a contiguous surface isolating diffused junction. The realization of very sharp breakdown was also confirmed by displaying the entire reverse volt-ampere characteristic of these units on a cathode ray tube oscilloscope.

Those skilled in the art will understand that the invention is not limited to the specific details shown and described for producing semi-conductor elements of the present invention. Illustratively, the invention is not limited by the method used in producing the initial semiconductor material identified as Step 1 of FIG. 2, or as element 10 of FIG. 1. As an example, a suitable semiconductor base could be produced by epitaxial growth of a layer of suitably doped semi-conductor material on top of a structural base of similarly doped or differentially doped semi-conductor material. In other words, any of the commonly practiced or suggested methods for producing either the base semi-conductor material or the base semi-conductor material with a diffused layer may be used in accordance with the present invention, provided the resulting structure permits the production of a regrowth portion through the diffused layer and into contact with the original or starting semiconductor material in the general manner and to accomplish the purpose of the present invention as described.

A semi-conductor element produced in accordance with the present invention may be used in accordance with commercial practices to produce a complete semiconductor device such as a zener type diode which is shown in FIGS. 4 and 5. Here the disc comprising the semi-conductor element indicated generally by the reference character 16 is mounted in the usual manner on a heat sink member 17 which forms one electrical contact, and a second contact 18 is made with the P+ regrowth region 12. Since the alloyed and diffused P regions are joined intimately together, however, the upper contact may be to the diffused P layer rather than to the P+ regrowth region, as indicated in FIG. 5. FIG. 5 is, therefore, identical with FIG. 4 except for this variation, and the same reference characters are employed therein with the prefix "1" to indicate modification. The upper contact 18, or 118 as the case may be, may be of any commonly used non-rectifying type such as a pressure contact, or a wire or area contact which is directly soldered, welded, brazed or otherwise bonded to the top of the disc 16.

It should not be assumed that the improved semiconductor element of the present invention is of significance only in the production of zener diodes and the like semi-conductor devices. As shown in FIG. 6, a semiconductor element for the production of a transistor may be produced by diffusing P layers 21 and 22 into opposite faces of N type semi-conductor material 23 and then forming P+ regrowth regions 24 and 26 by an alloying procedure such as described hereinabove, the said regrowth regions extending entirely through the diffused P layers so as to form P-N junctions between the P+ regrowth portions and the N type material. In FIG. 7, diffused P layers 27 and 28 are formed on opposite faces of an N type semi-conductor base 29 and a single regrowth portion 31 alloyed through one of the diffused P layers to form a junction between the regrowth portion and the N type semi-conductor material. While definite advantages are obtainable by either the structure of FIG. 6 or 7, the structure of FIG. 7 is of particular significance because it is possible by such structure to produce a transistor which is substantially unaffected by temperature changes, at least within operating temperature ranges. As an example, the temperature coefficient of breakdown voltage between the region 31 and the N type material 29 may be +2 millivolts per degree centigrade, while the temperature coefficient of breakdown voltage between the diffused P layer 28 and the N type semi-conductor material 29 may be −2 millivolts per degree centigrade, so that the two effects will substantially cancel each other out when temperature change occurs.

Those skilled in the art will understand, of course, that the polarities of the semi-conductor elements shown in FIGS. 6 and 7 may also be reversed. In producing transistor devices with the semi-conductor elements shown in FIGS. 6 and 7, usual practices in the industry may be followed with, in each instance, one contact to the center layer (N type material in the form illustrated), and a contact with each of the opposite faces of the element. The latter contacts may be made to either the regrowth portion or to the diffused layer as previously explained.

Except where indicated by the context, terms in the specification and claims are employed in a generic sense rather than in a restrictive sense. Illustratively, such terms as "wafer" and "disc" are used without regard to the specific cross-sectional area involved, and usually without regard to the geometric shape of a surface area.

While I have shown and described the invention in considerable detail so that those skilled in the art may understand the manner of practicing the same, the scope of the invention is limited only by the claim.

I claim:

A transistor type semi-conductor element having substantially zero temperature coefficient, said semi-conductor element comprising a doped semi-conductor wafer having diffused layers on opposite sides thereof, forming a center layer of one conductivity type and outside layers of an opposite conductivity type, with P-N junctions between said layers, and a re-growth region of the same conductivity type as said outside layers, said re-growth region alloyed through one such outside layer to form a P-N junction isolated from side edges of said first mentioned junction, said last mentioned junction between the re-growth region and center layer and said diffused layer junction opposite said re-growth region having temperature coefficient of breakdown voltage substantially cancelling each other, one being negative and one positive.

References Cited by the Examiner

UNITED STATES PATENTS

| | | | |
|---|---|---|---|
| 2,959,505 | 11/1960 | Riesz | 148—33 |
| 3,007,090 | 10/1961 | Rutz | 148—1.4 X |
| 3,044,147 | 7/1962 | Armstrong | 29—25.3 |
| 3,065,392 | 11/1962 | Pankove | 317—235 |
| 3,079,512 | 2/1963 | Rutz | 148—1.5 X |

OTHER REFERENCES

I.B.M. Technical Disclosure Bulletin, vol. 2, No. 1, June 1959, pages 23 and 24.

Semiconductors, G. Goudet and C. Meuleau, Essential Books, Inc., New Jersey, page 212.

DAVID L. RECK, *Primary Examiner.*

RAY K. WINDHAM, *Examiner.*

C. N. LOVELL, D. L. REISDORF, *Assistant Examiners.*